(12) United States Patent
Simsek-Ege et al.

(10) Patent No.: US 9,041,090 B2
(45) Date of Patent: May 26, 2015

(54) METHODS FOR FORMING A STRING OF MEMORY CELLS AND APPARATUSES HAVING A VERTICAL STRING OF MEMORY CELLS INCLUDING METAL

(71) Applicant: Micron Technology, Inc., Boise, ID (US)

(72) Inventors: Fatma Arzum Simsek-Ege, Boise, ID (US); Akira Goda, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/894,631

(22) Filed: May 15, 2013

(65) Prior Publication Data

US 2014/0339621 A1    Nov. 20, 2014

(51) Int. Cl.
| | | |
|---|---|---|
| *H01L 27/115* | (2006.01) |
| *H01L 27/105* | (2006.01) |
| *H01L 29/792* | (2006.01) |
| *H01L 29/788* | (2006.01) |
| *H01L 29/76* | (2006.01) |
| *H01L 21/8239* | (2006.01) |
| *H01L 21/336* | (2006.01) |

(Continued)

(52) U.S. Cl.
CPC ..... *H01L 27/11556* (2013.01); *H01L 29/66825* (2013.01); *H01L 29/788* (2013.01); *H01L 29/792* (2013.01); *H01L 29/66833* (2013.01); *H01L 27/1052* (2013.01)

(58) Field of Classification Search
CPC ................. H01L 29/42332; H01L 29/66825; H01L 29/792; H01L 21/28282; H01L 27/11551; H01L 29/7926; H01L 29/66833; H01L 29/42324; H01L 29/7889; H01L 27/11517; H01L 27/11524; H01L 29/517; H01L 29/7883; H01L 29/4232
USPC ................................................ 257/310–330
See application file for complete search history.

(56) References Cited

U.S. PATENT DOCUMENTS 6,063,666 A * 5/2000 Chang et al. .................. 438/261
7,829,935 B2 * 11/2010 Makihara et al. ............. 257/321

(Continued)

OTHER PUBLICATIONS

"International Application Serial No. PCT/US2014/011228, International Search Report and Written Opinion mailed Apr. 30, 2014", 17 pgs.

*Primary Examiner* — Howard Weiss
*Assistant Examiner* — Nelson Garces
(74) *Attorney, Agent, or Firm* — Schwegman Lundberg & Woessner, P.A.

(57) ABSTRACT

Methods for forming a string of memory cells and apparatuses having a vertical string of memory cells are disclosed. One such string of memory cells can be formed at least partially in a stack of materials comprising a plurality of alternating levels of control gate material and insulator material. A memory cell of the string can include floating gate material adjacent to a level of control gate material of the levels of control gate material. The memory cell can also include tunnel dielectric material adjacent to the floating gate material. The level of control gate material and the tunnel dielectric material are adjacent opposing surfaces of the floating gate material. The memory cell can include metal along an interface between the tunnel dielectric material and the floating gate material. The memory cell can further include a semiconductor material adjacent to the tunnel dielectric material.

19 Claims, 17 Drawing Sheets

(51) Int. Cl.
*H01L 21/04* (2006.01)
*H01L 29/66* (2006.01)

(56) References Cited

U.S. PATENT DOCUMENTS

| | | | |
|---|---|---|---|
| 8,437,192 B2 | 5/2013 | Lung et al. | |
| 8,507,976 B2 | 8/2013 | Joo | |
| 2007/0004140 A1 | 1/2007 | Jang et al. | |
| 2008/0009113 A1 | 1/2008 | Shimizu et al. | |
| 2008/0179659 A1 | 7/2008 | Enda et al. | |
| 2009/0230454 A1 | 9/2009 | Pekny | |
| 2009/0289297 A1 | 11/2009 | Kim et al. | |
| 2009/0310425 A1 | 12/2009 | Sim et al. | |
| 2010/0171162 A1* | 7/2010 | Katsumata et al. | 257/314 |
| 2011/0193153 A1 | 8/2011 | Higuchi et al. | |
| 2011/0316064 A1* | 12/2011 | Kim et al. | 257/314 |
| 2012/0012921 A1* | 1/2012 | Liu | 257/326 |
| 2012/0068247 A1 | 3/2012 | Lee et al. | |
| 2012/0175697 A1 | 7/2012 | Hall et al. | |
| 2012/0184078 A1 | 7/2012 | Kiyotoshi | |
| 2012/0211823 A1* | 8/2012 | Lim et al. | 257/326 |
| 2012/0220088 A1* | 8/2012 | Alsmeier | 438/261 |
| 2012/0231593 A1* | 9/2012 | Joo et al. | 438/264 |
| 2012/0241842 A1* | 9/2012 | Matsuda | 257/324 |
| 2012/0329224 A1 | 12/2012 | Kong et al. | |

\* cited by examiner

US 9,041,090 B2

METHODS FOR FORMING A STRING OF MEMORY CELLS AND APPARATUSES HAVING A VERTICAL STRING OF MEMORY CELLS INCLUDING METAL

TECHNICAL FIELD

The present embodiments relate generally to memory and a particular embodiment relates to a three-dimensional (3D) memory cell.

BACKGROUND

Memory devices are typically provided as internal, semi-conductor, integrated circuits in computers or other electronic devices. There are many different types of memory including random-access memory (RAM), read only memory (ROM), dynamic random access memory (DRAM), synchronous dynamic random access memory (SDRAM), and non-volatile (e.g., flash) memory.

Flash memory devices typically use a one-transistor memory cell that allows for high memory densities, high reliability, and low power consumption. Changes in threshold voltage of the cells, through programming of a charge storage structure, such as floating gates, trapping layers or other physical phenomena, determine the data state of each cell.

Due to ever increasing system speeds, memory manufacturers are under pressure to increase the bandwidth of their memory devices so that the memory does not become a speed bottleneck for the system. Memory manufacturers are also under pressure to constantly increase the memory density of the memory devices while maintaining, or even shrinking, the memory device size.

One way to increase both memory bandwidth and density is a three-dimensional structure in which strings of memory cells are fabricated vertically. FIG. 1 illustrates a cross-sectional view of a vertical memory cell string 120, 121 that preceded the present application.

An oxide 101 is formed on a source 100, which in this embodiment is conductively doped polysilicon. A level (e.g., layer) of conductively doped polysilicon (e.g., p-type polysilicon) 102 can be used as a gate of a select gate source (SGS) transistor for the string of memory cells 120, 121. An etch stop 103 is formed over the level of polysilicon 102, such as one that can be used during the process for forming the string 120, 121 to provide an etch resistance for the level of polysilicon 102 in order to slow the etching process in a future etching step.

Alternating levels 104-114 of an oxide 104, 106, 108, 110, 112 and conductively doped polysilicon (e.g., n-type polysilicon) 105, 107, 109, 111, 113 are formed over the etch stop 103. The levels of polysilicon 105, 107, 109, 111, 113 can be used as the control gates for the memory cells of the string of memory cells 120, 121. The levels of oxide 104, 106, 108, 110, 112 can be used to insulate control gates of adjacent memory cells. A level of conductively doped polysilicon (e.g., p-type polysilicon) 115 is formed on top of the last level of oxide 114. The level of polysilicon 115 can be used as a gate of a select gate drain transistor for the string of memory cells. Recesses of approximately 25 nm are formed into levels of the polysilicon 105, 107, 109, 111, 113.

For purposes of clarity, the following continued description of FIG. 1 focuses on only one memory cell 140 of string 120, 121. A recess is lined with an interpoly dielectric (IPD) 150 and filled with conductively doped polysilicon 130. A tunnel dielectric 151 is formed (e.g., grown or deposited) adjacent to the polysilicon 130. A pillar of semiconductor material (e.g., conductively doped polysilicon) 116 is formed through the level of polysilicon 115, the alternating levels of oxide and polysilicon 104-114, the etch stop 103, the level of polysilicon 102, and the oxide 101, with the pillar of polysilicon 116 being adjacent to the tunnel dielectric.

DETAILED DESCRIPTION

Figure 1:
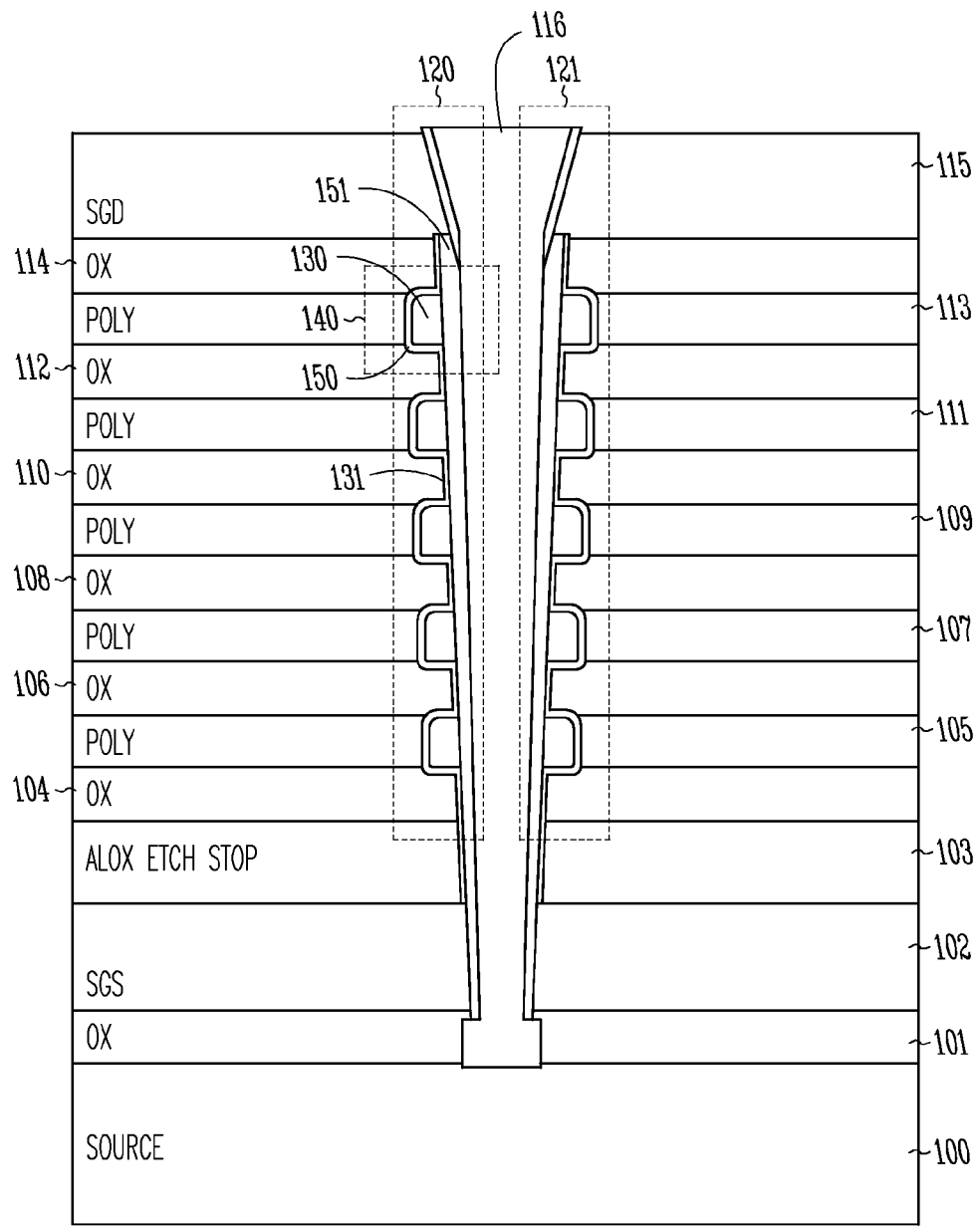
FIG. 1 illustrates a cross-sectional view of a memory cell string that preceded the present application.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
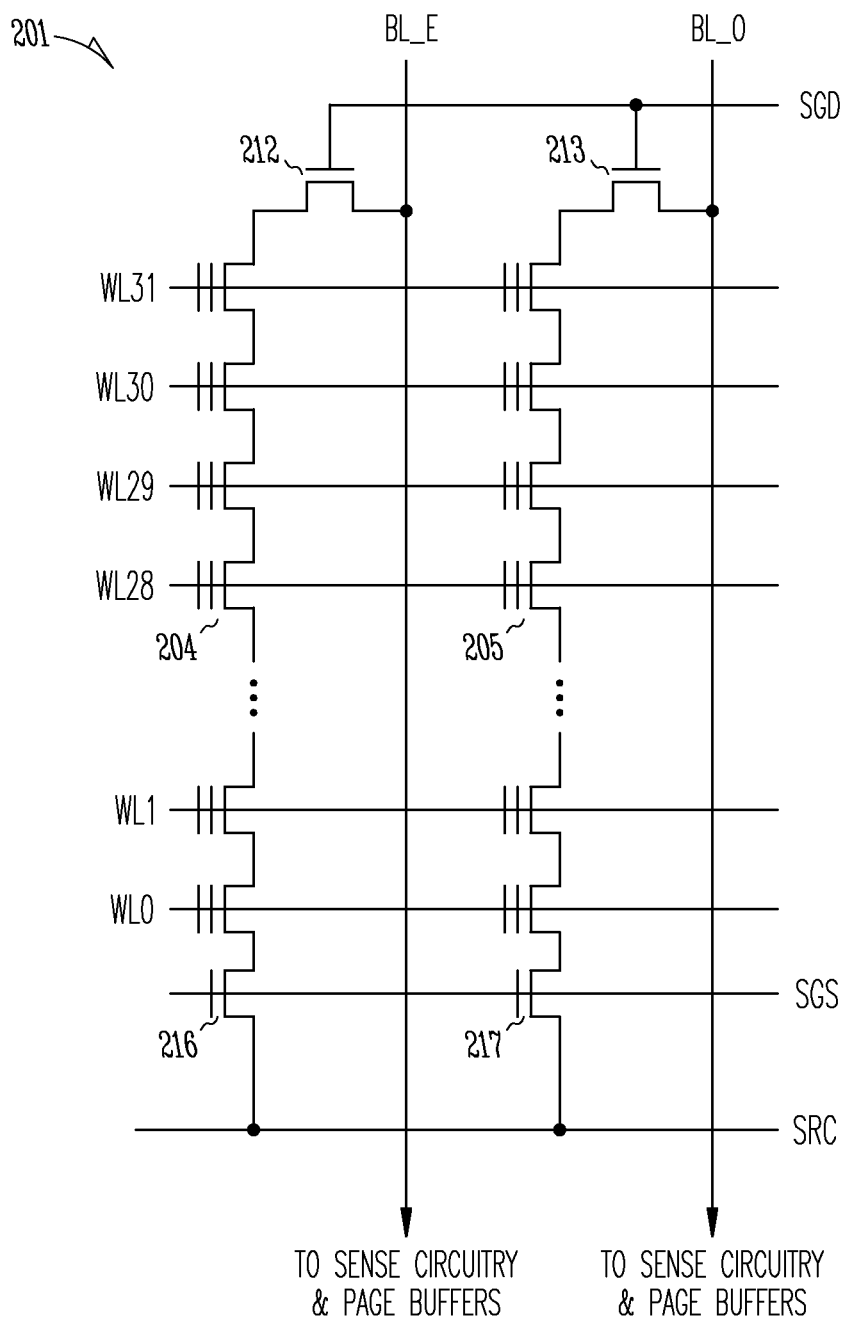
FIG. 2 illustrates a schematic diagram of one embodiment of strings of memory cells.

FIG. 2 illustrates a schematic diagram of one embodiment of a portion of a NAND architecture memory array 201 comprising strings of non-volatile memory cells. The NAND architecture is for purposes of illustration only as the embodiments disclosed herein are not limited to any one memory architecture. In one embodiment, the memory array is formed as a three-dimensional architecture so that each string can be formed vertically as described subsequently.

The memory array 201 comprises an array of non-volatile memory cells (e.g., floating gate) arranged in columns such as strings 204, 205. Each memory cell in a row is coupled to a common control gate (e.g., word line) WL0-WL31, that spans across multiple strings 204, 205. Odd and even data lines (e.g., bit lines) BL_O and BL_E are coupled to the strings 204, 205 through drain select gates 212, 213 (e.g., transistors) that are controlled by a drain select gate control signal SGD coupled to their control gates. The bit lines BL_O and BL_E are eventually coupled to sense circuitry and page buffers (not shown) that detect and store the state of each cell, such as by sensing current or voltage on a selected bit line.

Each string 204, 205 of memory cells is coupled to a source SRC through a source select gate 216, 217 (e.g., transistor). The source select gates 216, 217 are controlled by a source select gate control signal SGS coupled to their control gates.

Each memory cell can be individually programmed as either a single level cell (SLC) or a multiple level cell (MLC). A cell's threshold voltage ($V_t$) can be used as an indication of the data stored in the cell. For example, in an SLC memory device, a $V_t$ of 2.5V may indicate a programmed cell while a $V_t$ of –0.5V may indicate an erased cell. In an MLC memory device, multiple $V_t$ ranges can each indicate a different state by assigning a bit pattern to a specific $V_t$ range.

In order to increase memory die density, the strings of memory cells 204, 205 can be formed vertically as described subsequently. Performance of the memory cells (e.g., programming/erase speed) can be enhanced by, for example, the addition of metal along an interface between the tunnel dielectric material and the floating gate material, such as that which can be formed using a subsequently described fabrication technique.

Figures 3, 4:
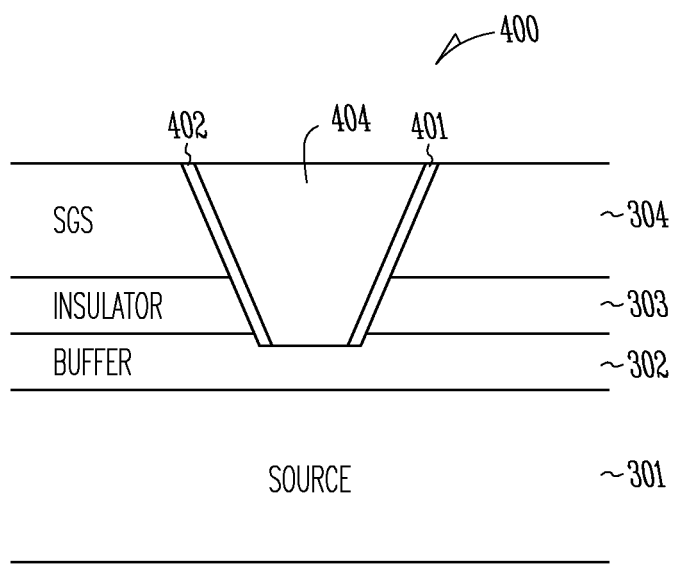
FIG. 3 illustrates fabrication steps for forming vertical strings of memory cells.
FIG. 4 illustrates additional fabrication steps for forming vertical strings of memory cells.

FIG. 3 illustrates fabrication steps for forming vertical strings of memory cells. A source 301 is formed in and/or on a semiconductor. In one embodiment, the source 301 can comprise a conductive material, such as conductively doped polycrystalline silicon (polysilicon). For avoidance of doubt, when "a material" is referred to herein, it should be understood by one of ordinary skill in the art that such a material can be a single material or a plurality of materials (e.g., as in the case of a composite or laminate film). In one embodiment, the source 301 can have a thickness in a range of 50-100 nm.

A buffer material 302 can be formed over (e.g., on) the source 301. The buffer material 302 can be, for example, n+ doped polysilicon. The buffer material 302 can be used to isolate the source 301. In one embodiment, the buffer material 302 can be approximately 10 nm thick.

A first level of insulator material 303 can be formed over (e.g., on) the buffer material 302. If the buffer material 302 is not used, the first level of insulator material 303 can be formed on the source 301. In one embodiment, the first level of insulator material 303 can be an approximately 20 nm thick oxide that can be grown, e.g., by oxidation of a top surface of the source 301 or deposited (or combinations thereof).

A level of conductive material 304 (e.g., conductively doped polysilicon) can be formed over (e.g., on) the first level of insulator material 303. The level of conductive material 304 can be used as the gate of a source select gate (SGS) transistor, and thus is hereinafter sometimes referred to as "the SGS level". The SGS level 304 can comprise p-doped polysilicon. In one embodiment, the SGS level 304 can be approximately 150 nm thick.

FIG. 4 illustrates additional fabrication steps for forming vertical strings of memory cells. A trench 400 can be formed into the buffer material 302, the first level of insulator material 303, and the SGS level 304. An oxide 401, 402 can be formed along the sides of the trench 400. The trench can then be filled with a semiconductor material 404 (e.g., polysilicon). The oxide 401, 402 can be either deposited or grown, for example. If the buffer material 302 is not present, an oxide material may be formed at the bottom of the channel to isolate the polysilicon fill material 404 from the source line material 301.

Figure 5:
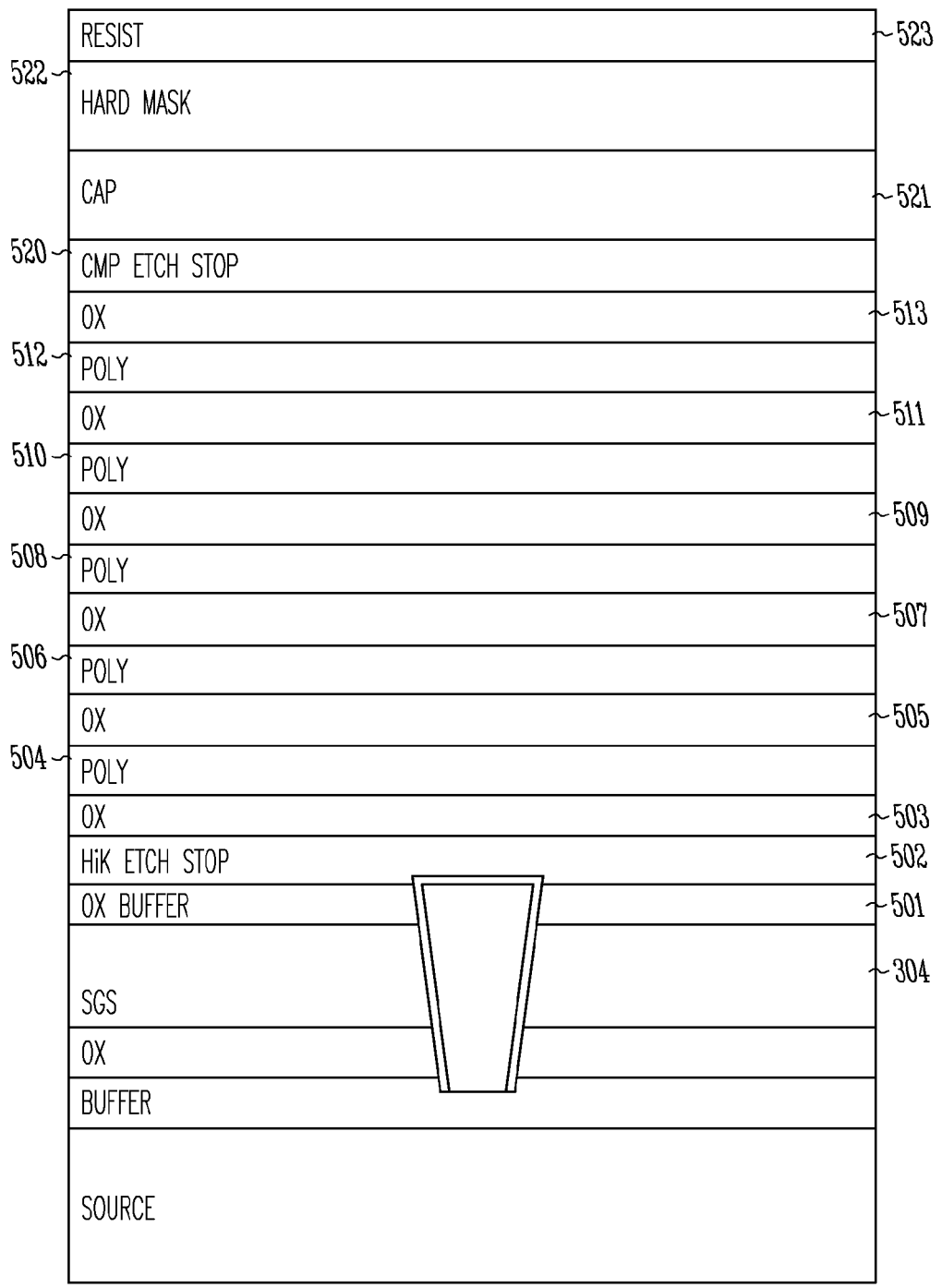
FIG. 5 illustrates additional fabrication steps for forming vertical strings of memory cells.

FIG. 5 illustrates additional fabrication steps for forming vertical strings of memory cells. A second level of insulator material 501 can be formed over (e.g., on) the SGS level 304. The SGS level 304 can be formed separately between the first and second levels of insulator material 303 and 501 to prevent metal growth on the SGS level 304 during subsequent processing. An etch stop material 502 (e.g., a high-K dielectric material, such as aluminum oxide) can be formed over (e.g., on) the second level of insulator material 501. In one embodiment, the second level of insulator material 501 can be formed approximately 10 nm thick and the etch stop material 502 can be formed approximately 30 nm thick. Alternate embodiments can use other dimensions.

A plurality of vertically stacked, alternating levels of insulator material (e.g., oxide material) 503, 505, 507, 509, 511, 513 and control gate material (e.g., polysilicon) 504, 506, 508, 510, 512 can be formed over (e.g., on) the etch stop material 502. In one embodiment, each insulator level 503, 505, 507, 509, 511, 513 can be used to insulate between adjacent levels of control gate material 504, 506, 508, 510, 512 of the memory cell string. In one embodiment, the insulator levels 503, 505, 507, 509, 511, 513 can be formed approximately 20 nm thick while the control gate levels 504, 506, 508, 510, 512 can be formed approximately 30 nm thick. Alternate embodiments can use other dimensions. The insulator levels 503, 505, 507, 509, 511, 513 can be formed by deposition or grown, for example. In one embodiment, the control gate levels 504, 506, 508, 510, 512 can comprise, for example, n-type polysilicon.

The use of oxide for the insulator levels and polysilicon for the control gate levels is for purposes of illustration only. Alternate embodiments can use other materials for the insulator levels that have insulation properties and/or other materials for the control gate levels that have conductive properties (e.g., one or more metals or alloys thereof).

A chemical mechanical planarization (CMP) stop material 520 can be formed over (e.g., on) the top insulator level 513. In one embodiment, the CMP stop material 520 is an approximately 10 nm thick nitride material. A capping material 521 can be formed over (e.g., on) the CMP stop material 520 to provide a protective cap for subsequent steps. The capping material 521 can be, for example, an approximately 120 nm thick oxide, nitride, polysilicon, and or high-K dielectric material. Alternate embodiments can use other dimensions and/or materials. A hard mask (e.g., a carbon dielectric anti-reflective coating) 522 can be formed over (e.g., on) the capping material 521 and a resist material 523 formed over (e.g., on) the hard mask 522.

Figure 6:
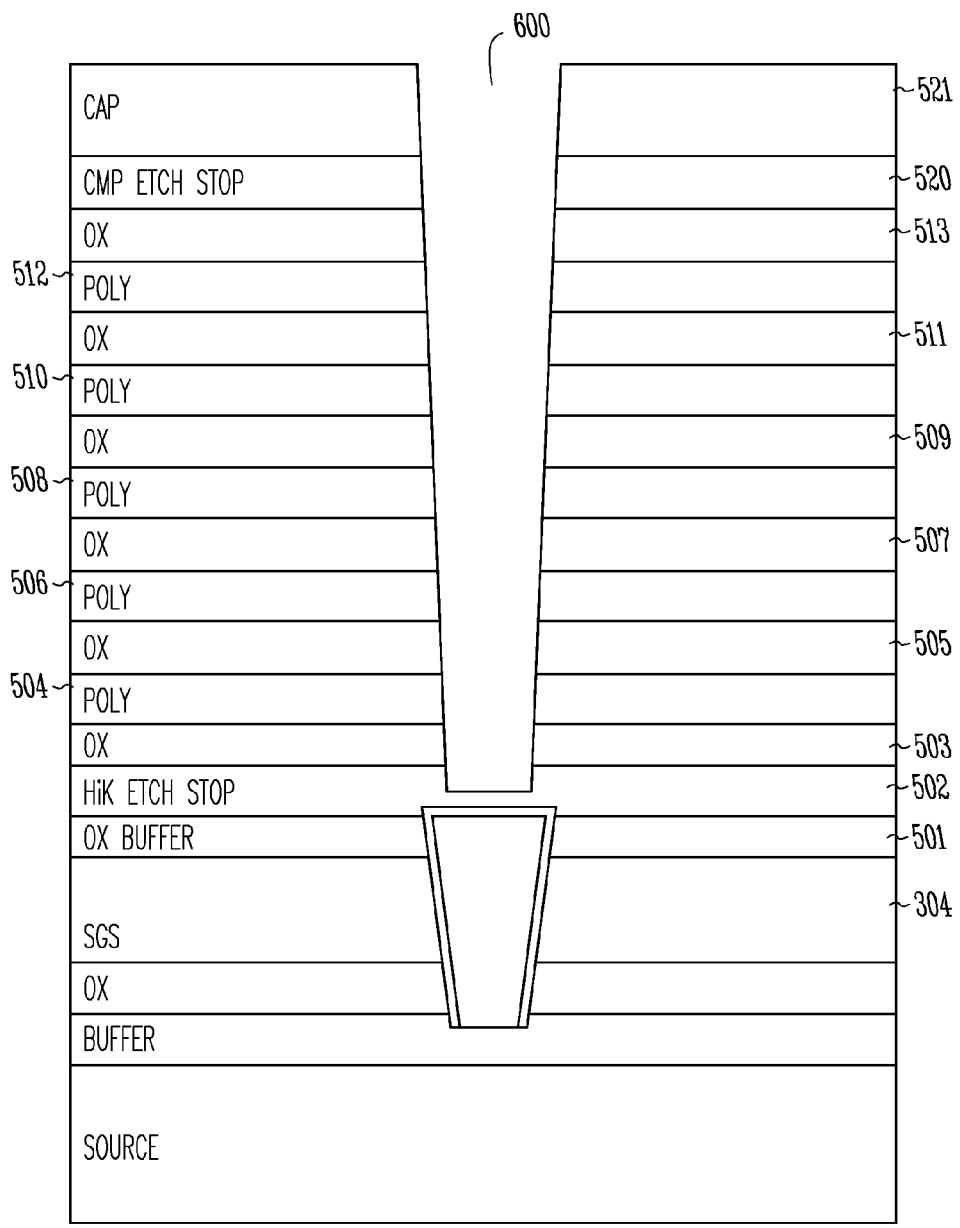
FIG. 6 illustrates additional fabrication steps for forming vertical strings of memory cells.

FIG. 6 illustrates additional fabrication steps for forming vertical strings of memory cells. An opening 600 can be formed through previously formed levels 501-513, 520, 521. At least a portion of the second level of insulator material 501 can be left between the opening 600 and the top of the filled trench 400, such as to reduce leakage.

Figure 7:
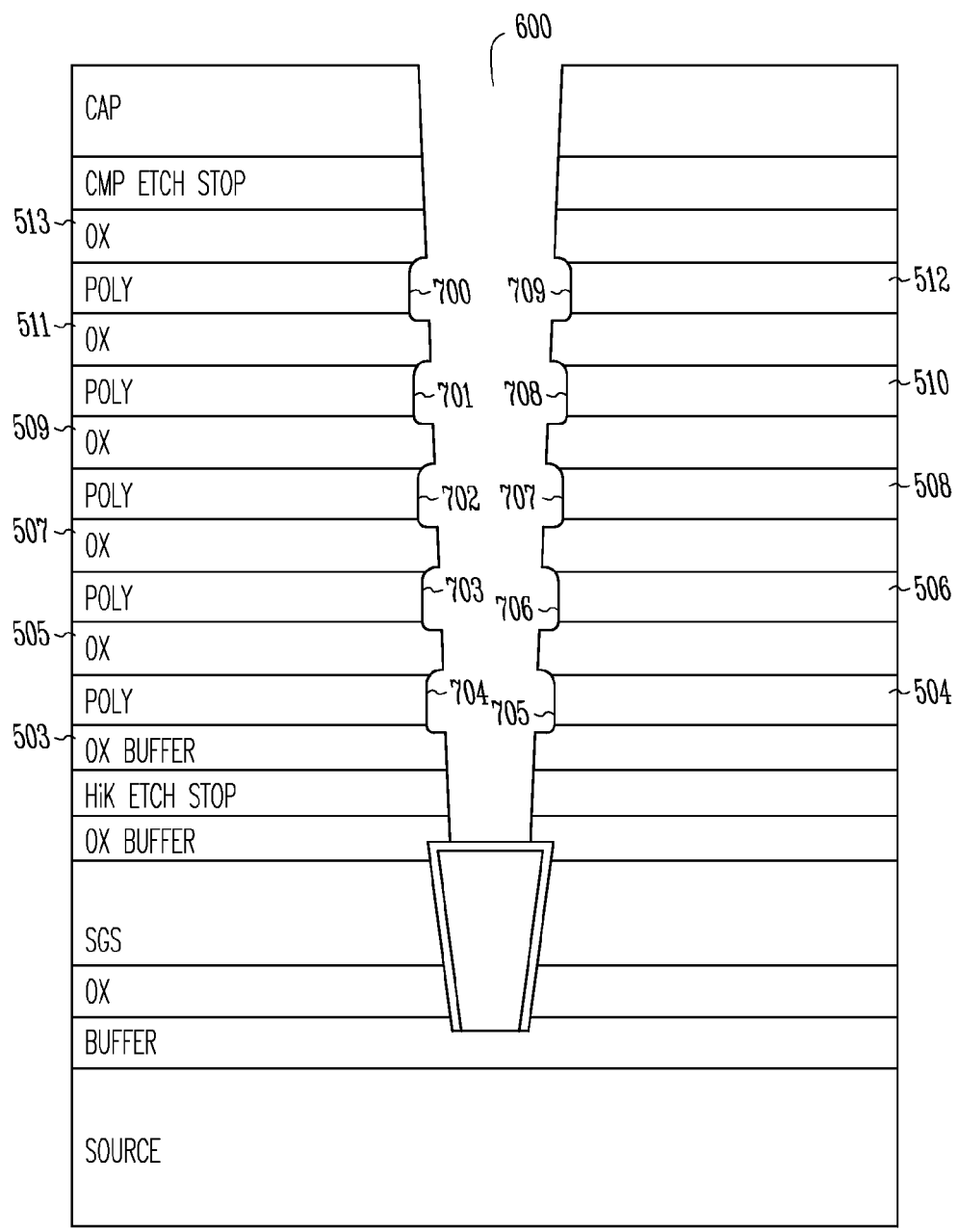
FIG. 7 illustrates additional fabrication steps for forming vertical strings of memory cells.

FIG. 7 illustrates additional fabrication steps for forming vertical strings of memory cells. Directional etching can be used to etch portions of the levels of control gate material 504, 506, 508, 510, 512 through the opening 600 in order to extend the opening 600 into recesses 700-709 that are bounded on their top and bottom by respective levels of insulator material 503, 505, 507, 509, 511, 513.

The recesses 700-709 can be approximately 15 nm deep. Prior recesses of which the inventors are aware were typically formed 25 nm deep. Alternate embodiments can use other dimensions.

Figure 8:
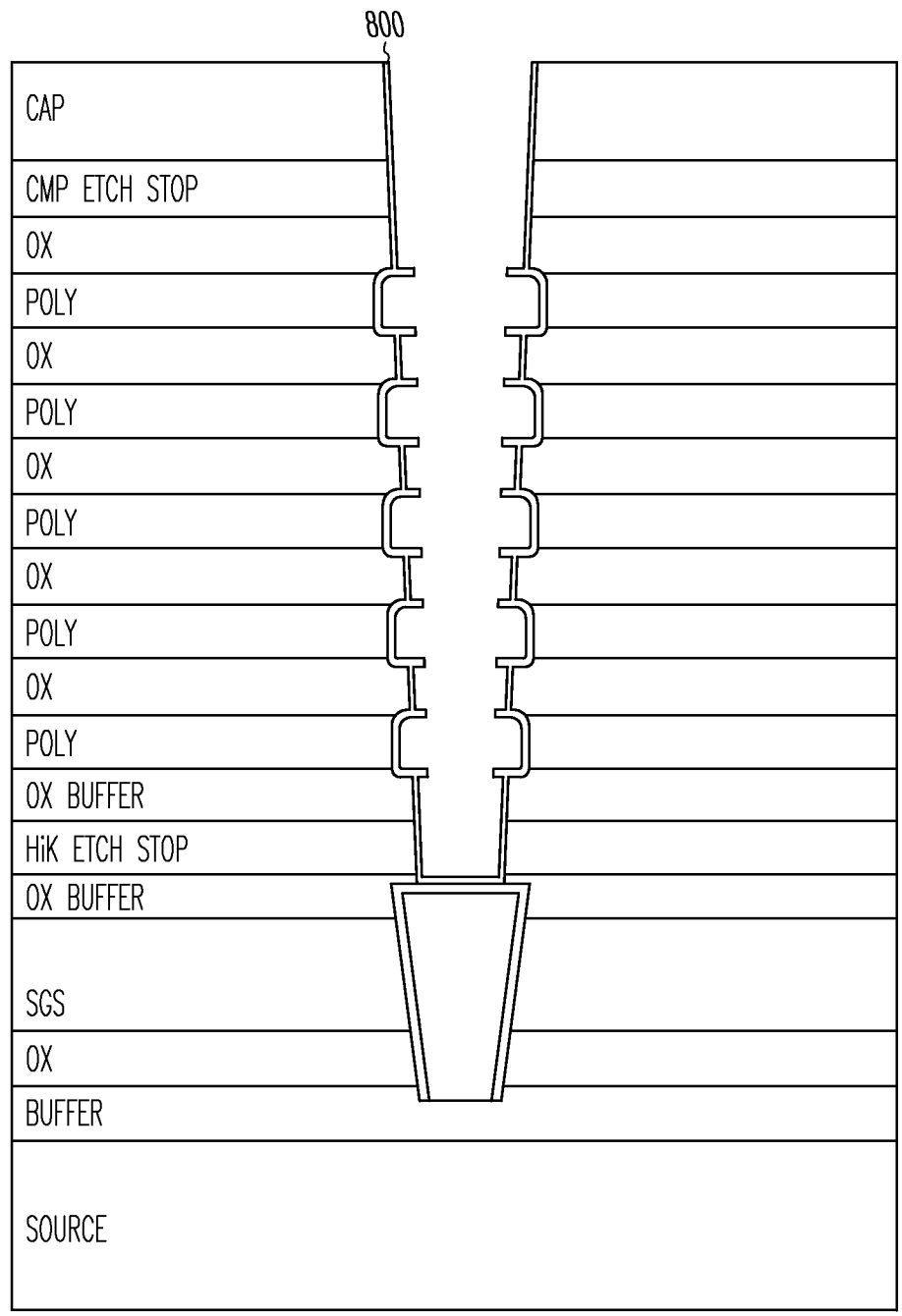
FIG. 8 illustrates an additional fabrication step for forming vertical strings of memory cells.

FIG. 8 illustrates an additional fabrication step for forming vertical strings of memory cells. Charge blocking dielectric material, such as an interpoly dielectric (IPD) material 800, can be formed along the sidewalls of the opening 600 such that it at least partially lines the recesses 700-709. In one embodiment, the interpoly dielectric material 800 can be an oxide-nitride-oxide (ONO) film.

Figure 9:
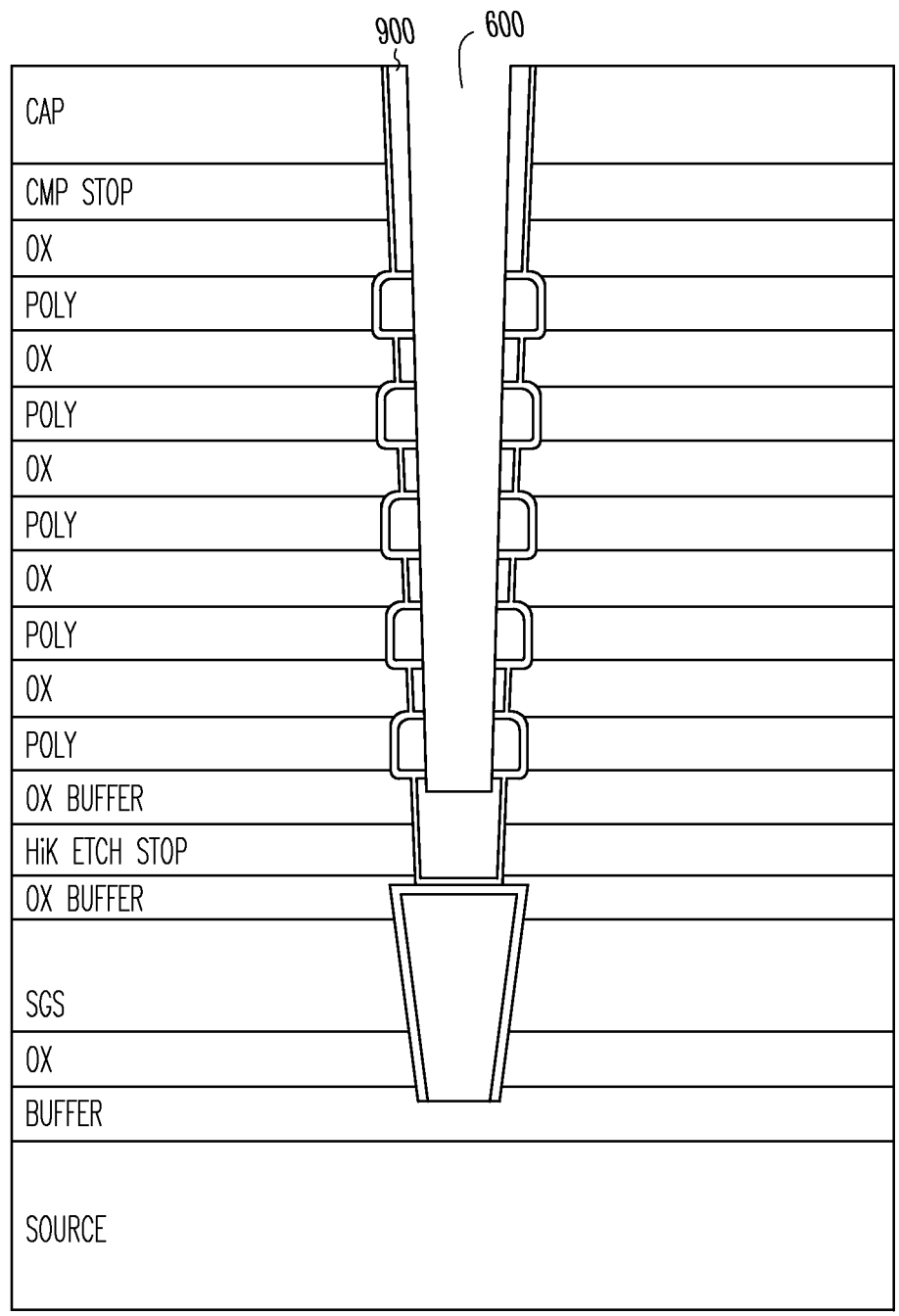
FIG. 9 illustrates an additional fabrication step for forming vertical strings of memory cells.

FIG. 9 illustrates an additional fabrication step for forming vertical strings of memory cells. A floating gate material 900 can be formed along the sidewalls and bottom of the opening 600. The floating gate material 900, in one embodiment, can be a polysilicon material that can be conformally deposited approximately 5-7 nm thick. Alternate embodiments can use other dimensions. The floating gate material 900 can fill the (at least partially lined) recesses 700-709.

Figure 10:
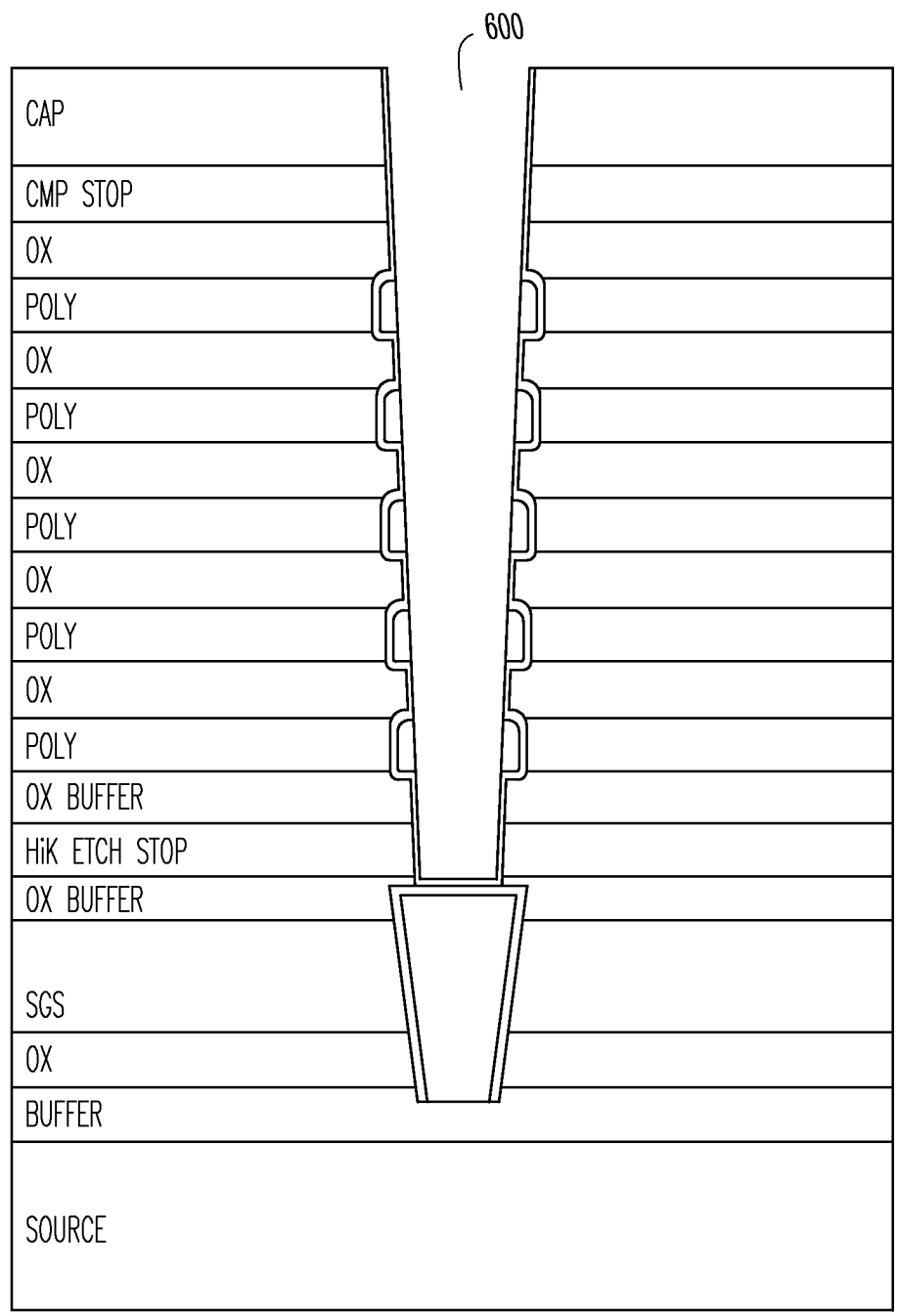
FIG. 10 illustrates an additional fabrication step for forming vertical strings of memory cells.

FIG. 10 illustrates an additional fabrication step for forming vertical strings of memory cells. Excess floating gate material 900 (e.g., polysilicon) can be removed from the sidewalls and bottom of the opening 600 such that only the floating gate material that fills the recesses 700-709 remains.

Figure 11:
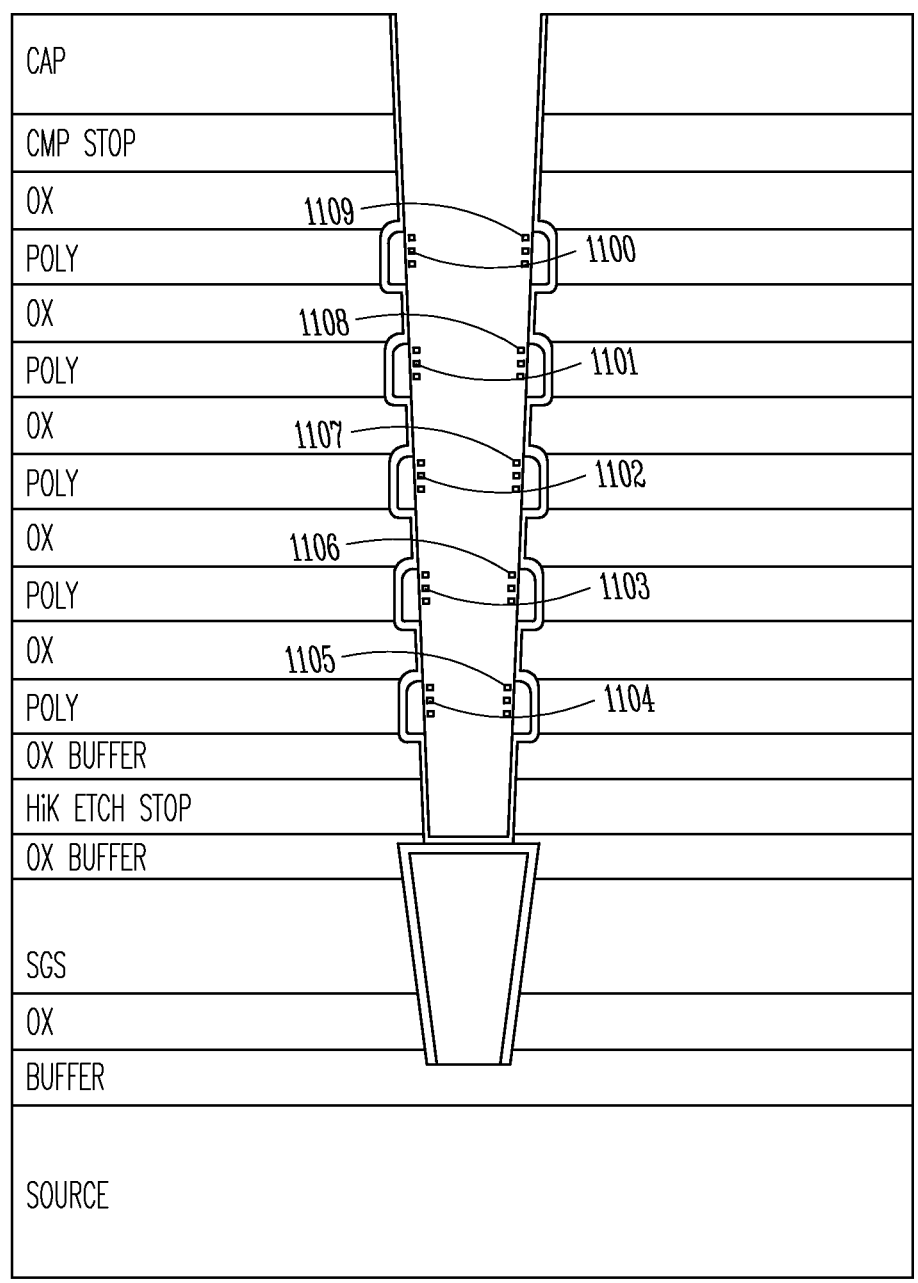
FIG. 11 illustrates additional fabrication steps for forming vertical strings of memory cells.

FIG. 11 illustrates additional fabrication steps for forming vertical strings of memory cells. One step can form metal nano-particles 1100-1109 along a surface of the floating gate material 900 formed in each recess 700-709. In one embodiment, the metal nano-particles 1100-1109 can be grown selectively (e.g., atomic layer deposition ALD) on the surface of the floating gate material 900. The entire opening 600 can be exposed to a metal precursor gas and metal nano-particles 1100-1109 can adhere to the surface of the floating gate material 900 more so than IPD material 800 that may be exposed in the opening 600 (e.g., the exposed oxide of an ONO film) and/or other insulator material exposed in the opening 600 between control gate levels (e.g., any exposed surfaces of the insulator levels).

Excess metal nano-particles can then be cleaned from portions of the opening 600 where it is not desired to have metal nano-particles by a cleaning process (e.g., Ammonia hydroxide-hydrogen Peroxide-water Mixture APM). The cleaning process can be followed by a stabilizing treatment (e.g., nitridization) to stabilize the metal particles uniformly on the floating gate surfaces.

The metal nano-particles 1100-1109 can be, for example, formed on the surface of the floating gate material adjacent to the opening 600 and/or infused into the floating gate material 900. For example, a high temperature anneal process performed after the cleaning process may infuse the nano-particles into the floating gate material.

In one embodiment, metal nano-particles 1100-1109 can be used instead of a metal film in part because the metal nanoparticles 1100-1109 can be easier to clean from portions of the opening 600 where metal nanoparticles are not desirable in order to prevent two or more floating gates from shorting together. Additionally, the metal nanoparticles 1100-1109 can be diffused into polysilicon floating gate material more easily than a metal film. In one embodiment, the nanoparticles can define the charge storage area of each memory cell.

The metal nanoparticles formed along a surface of the floating gate can include at least one of the following: ruthenium (Ru), ruthenium oxide ($RuO_x$), titanium nitride (TiN), titanium aluminum nitride (TiAlN), tungsten nitride (WN), tungsten carbon nitride (WCN), tungsten silicide ($WSi_x$), tantalum nitride (TaN), tantalum aluminum nitride (TaAlN), ruthenium silicide (RuSi), hafnium silicide (HfSi), hafnium (Hf), zirconium (Zr), zirconium silicide (ZrSi), cobalt silicide (CoSi), or nickel silicide (NiSi). These metals are for purposes of illustration only as the present embodiments are not limited to any one metal.

Figure 12:
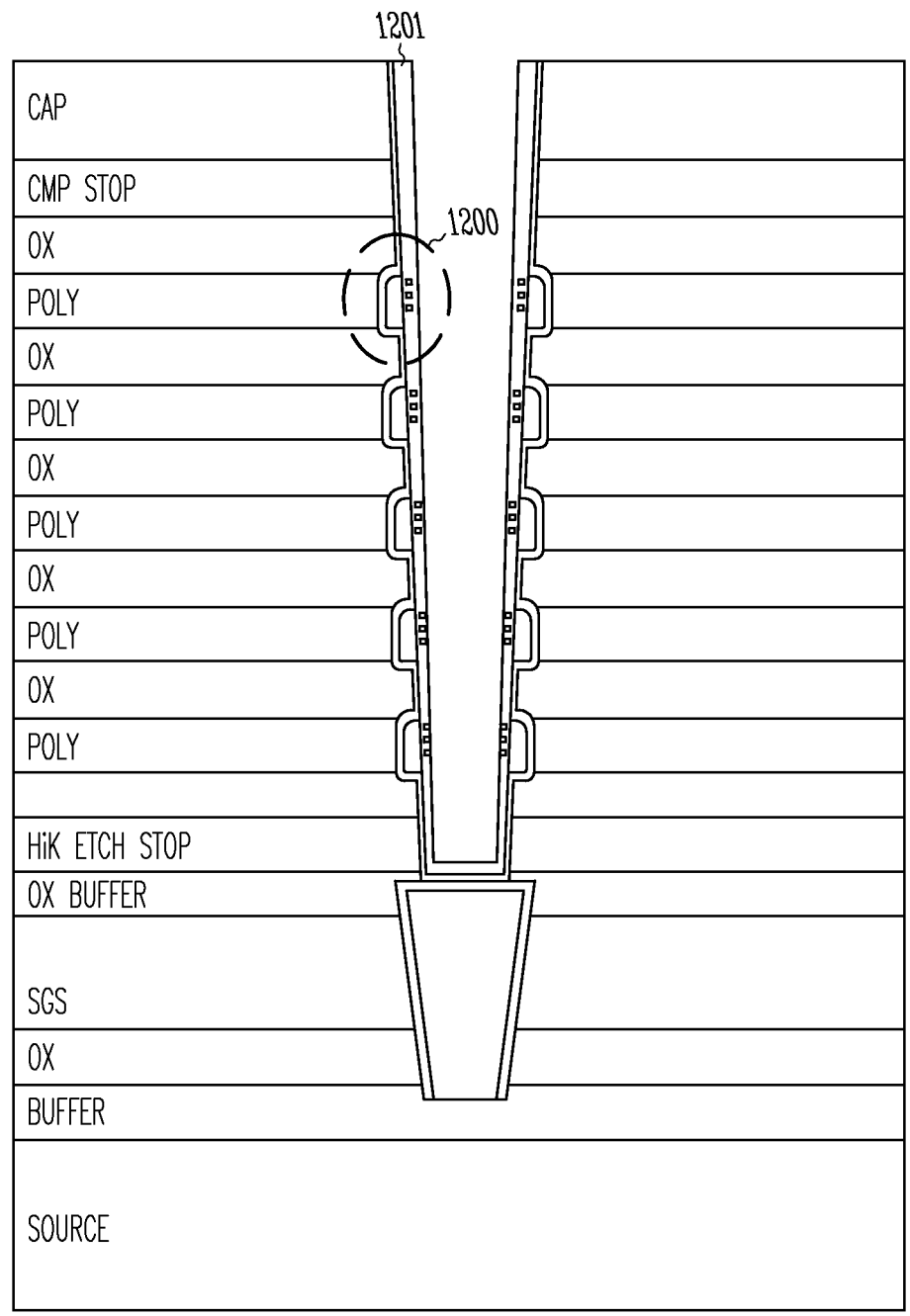
FIG. 12 illustrates additional fabrication steps for forming vertical strings of memory cells.

FIG. 12 illustrates an additional fabrication step for forming vertical strings of memory cells. A tunnel dielectric material 1201 (e.g., oxide) can be formed on the sidewalls and bottom of the opening 600. The metal nanoparticles can also be covered by the tunnel dielectric material 1201. The tunnel dielectric material 1201 can be an oxide that is grown on exposed surfaces in the opening 600 by an oxidation process or deposited, for example. One memory cell 1200 from the resulting string of memory cells is shown in FIG. 13 and described in greater detail subsequently.

Figure 13:
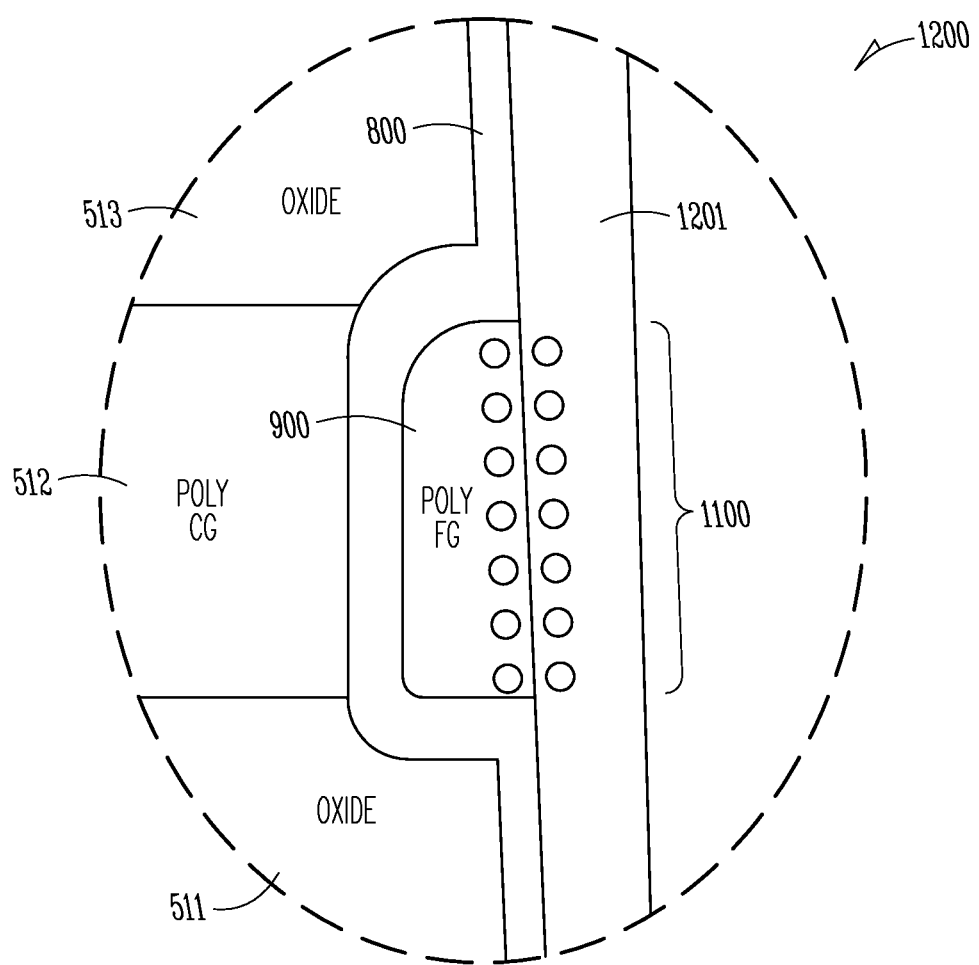
FIG. 13 illustrates a more detailed view of a structure resulting from the fabrication steps of FIGS. 11 and 12.

FIG. 13 illustrates a more detailed view of a portion of a 3D memory cell structure 1200 resulting from the previous fabrication steps. This detailed view shows floating gate material (e.g., polysilicon) 900 in a recess formed adjacent to control gate material 512 between levels of insulator material 511, 513. The recess is lined with interpoly dielectric material 800 (e.g. ONO). The metal nano-particles 1100 can be formed along a surface of the floating gate material 900 (e.g., on the surface of the floating gate material and/or diffused into the floating gate material 900 and/or covered by the tunnel dielectric material 1201 (e.g., oxide)).

Figure 14:
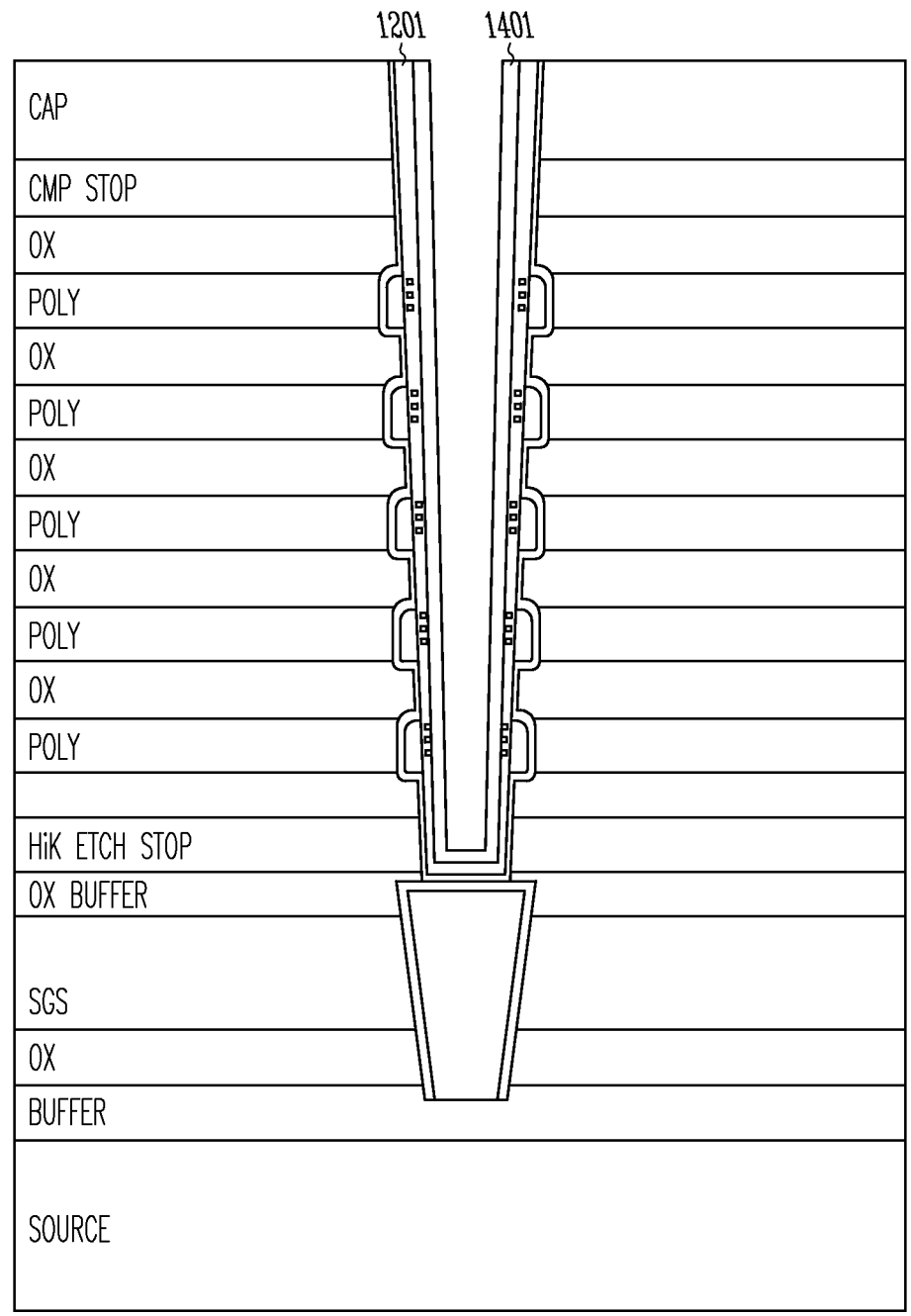
FIG. 14 illustrates additional fabrication steps for forming vertical strings of memory cells.

FIG. 14 illustrates an additional fabrication step for forming vertical strings of memory cells. A sacrificial material (e.g., polysilicon) 1401 can be formed on the sidewalls and bottom of the opening 600 over the tunnel dielectric material 1201 formed in the previous step. This material 1401 can be used to protect the previously formed tunnel dielectric material 1201 during a subsequent etching process. At least portions of the sacrificial material 1401 may be removed during the subsequent etching process.

Figure 15:
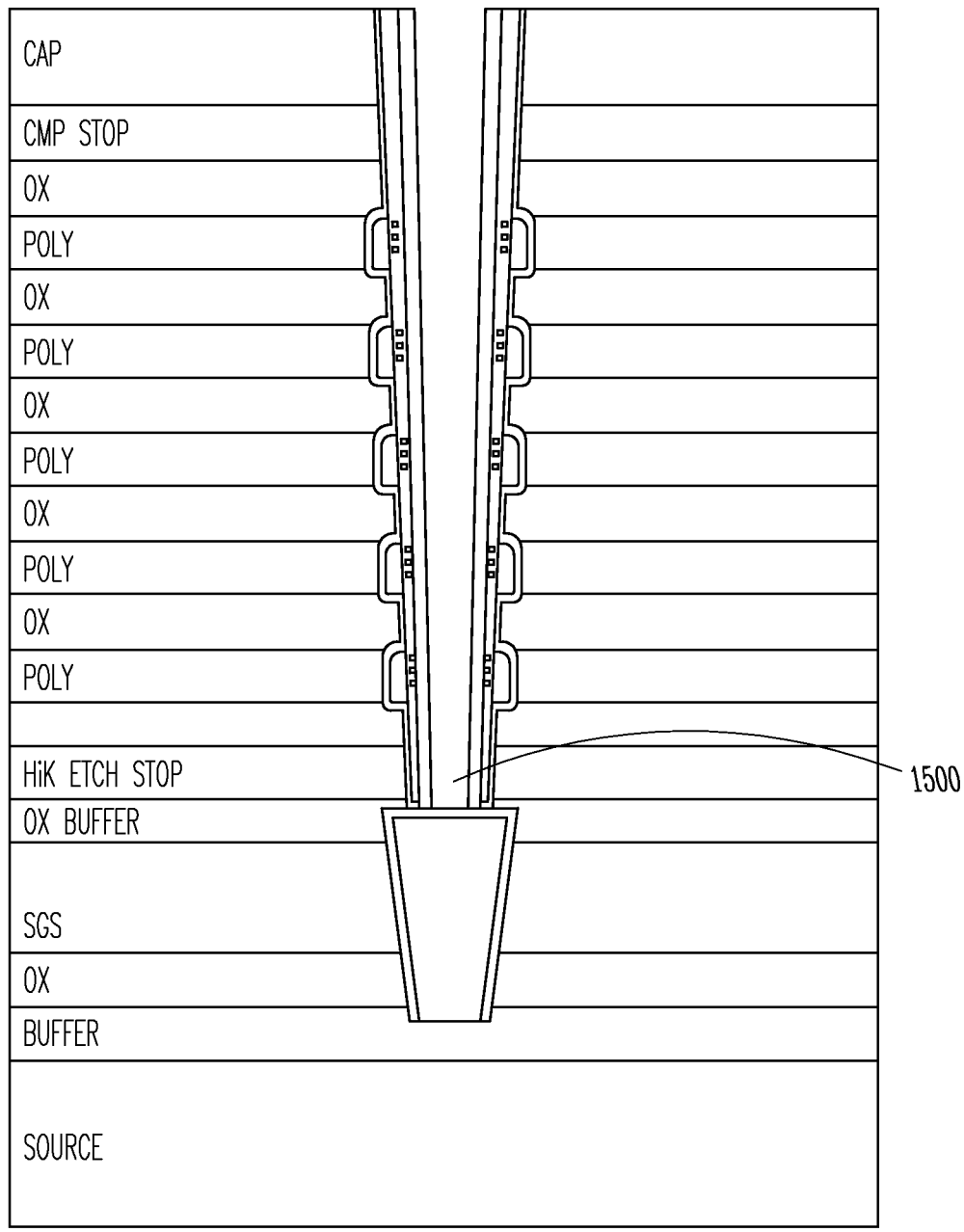
FIG. 15 illustrates additional fabrication steps for forming vertical strings of memory cells.

FIG. 15 illustrates an additional fabrication step for forming vertical strings of memory cells. Sacrificial material 1401 and interpoly dielectric material 800 can be removed from the bottom 1500 of the opening 600. In one embodiment, a dry etch process can be used to remove such materials from the bottom of the opening 600. At least portions of the sacrificial material 1401 from the previous step may be removed from the sidewalls of the opening 600 during this process as well.

Figure 16:
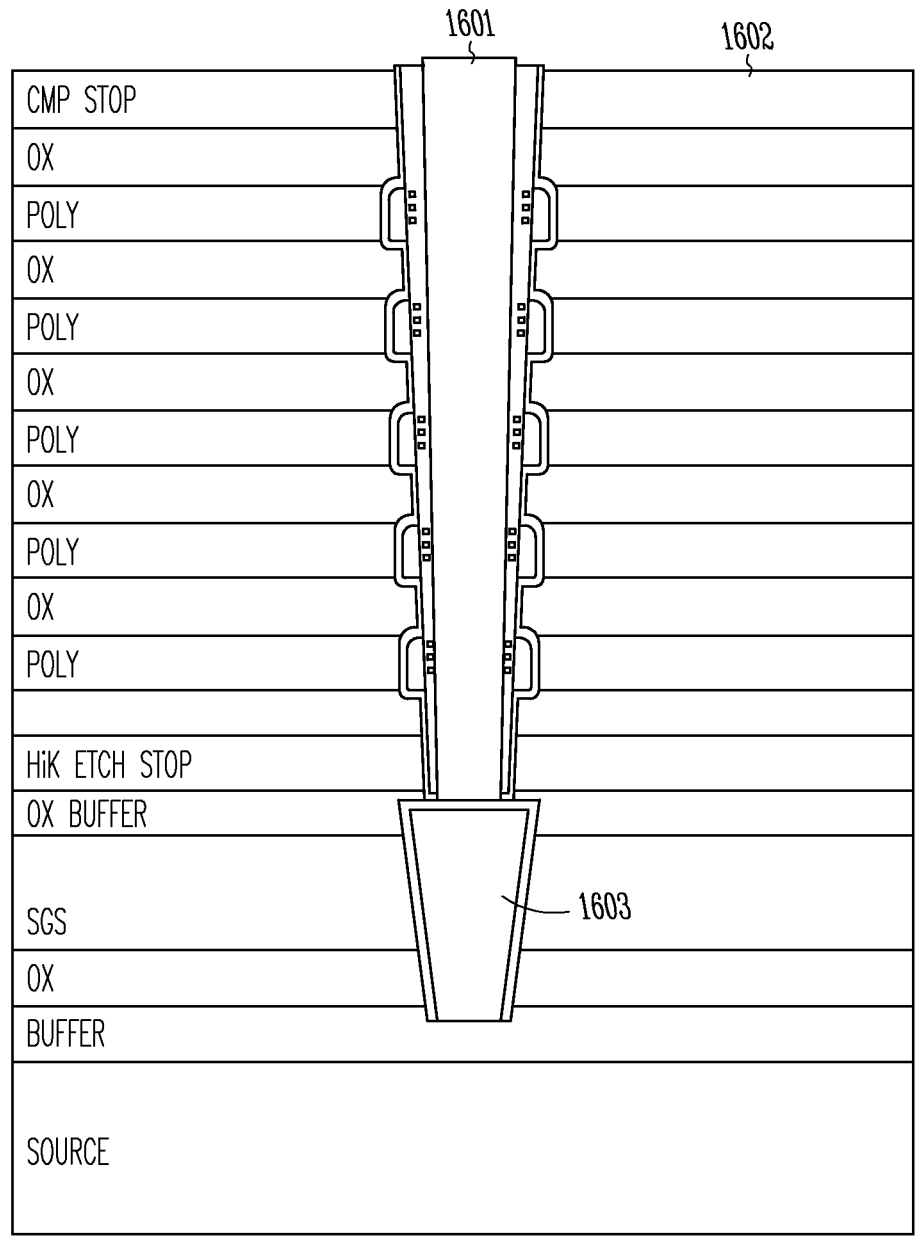
FIG. 16 illustrates additional fabrication steps for forming vertical strings of memory cells.

FIG. 16 illustrates additional fabrication steps for forming vertical strings of memory cells. The opening 600 can be filled with a semiconductor material 1601 (e.g., conductively doped polysilicon) to act as a memory cell channel for the string of memory cells. The semiconductor material 1601 is formed in contact with the semiconductor material 1603 used to fill trench 400 (labeled 404 in FIG. 4). The semiconductor material 1603 can act as the channel for a SGS transistor. A CMP process can then be used to remove the capping material (521) and the CMP stop material 1602 can be stripped.

Figure 17:
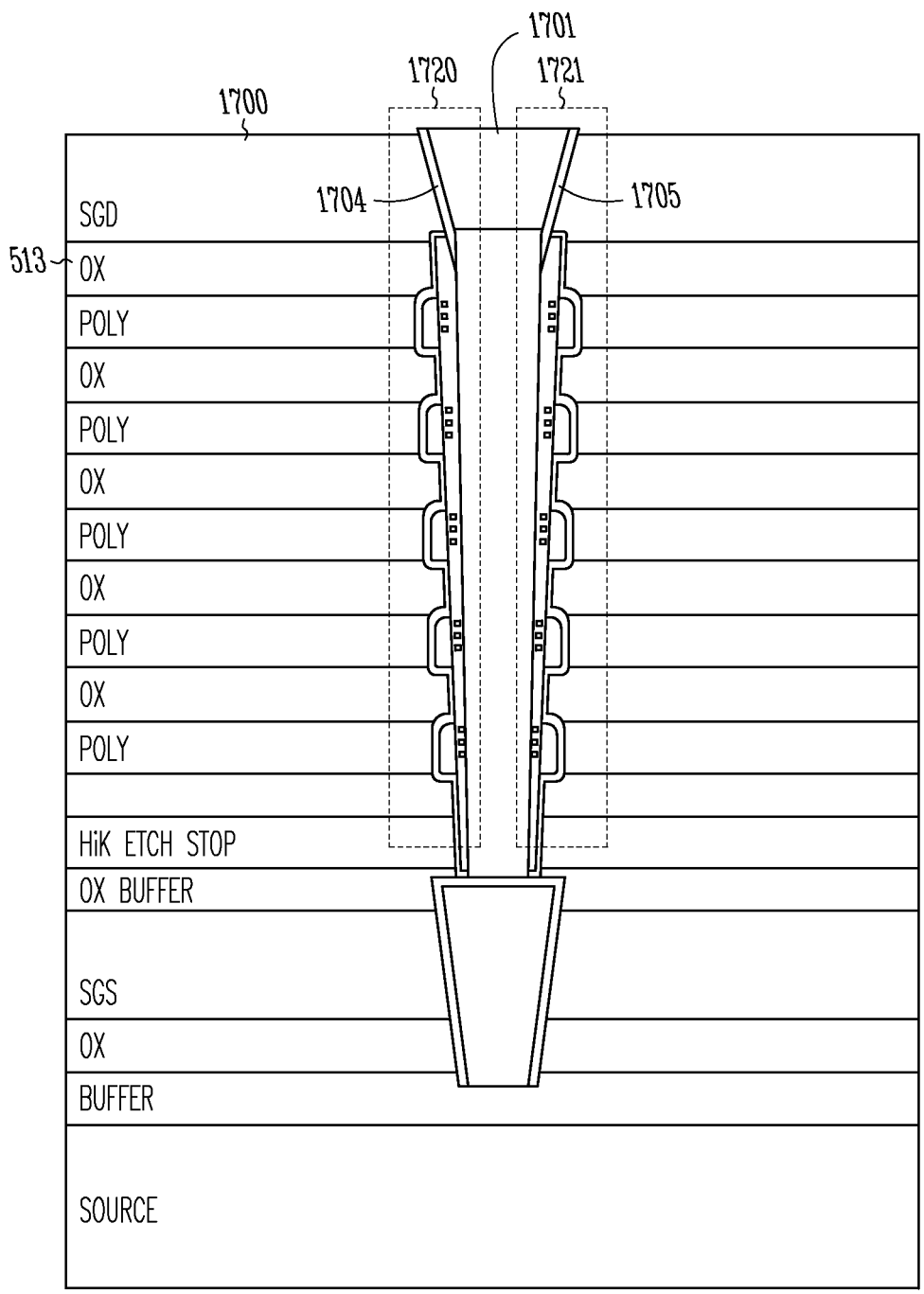
FIG. 17 illustrates additional fabrication steps for forming vertical strings of memory cells.

FIG. 17 illustrates additional fabrication steps for forming vertical strings of memory cells. A conductive material 1700 (e.g., conductively doped polysilicon) can be formed over (e.g., on) the now exposed top insulator material 513 to form a control gate for the drain select gate (SGD) transistor. The conductive material 1700 can then be etched to form a trench over the semiconductor material 1601. A gate dielectric material 1704, 1705 (e.g., an oxide) can then be formed along the sidewalls of the trench. The trench can then be filled with a semiconductor material 1701 (e.g., polysilicon) so that it is in contact with semiconductor material 1601. The semiconductor material 1701 can act as the channel for the SGD transistor. In one or more embodiments, semiconductor materials 1700 and 1603 are of a different conductivity type than semiconductor material 1601 (e.g., materials 1700 and 1603 can be n-type polysilicon while material 1601 is p-type polysilicon, or materials 1700 and 1603 can be p-type polysilicon while material 1601 is n-type polysilicon).

The resulting structure illustrated in FIG. 17 includes a string of memory cells 1720, 1721 such as one of the strings 204,205 illustrated in FIG. 2. This structure can be repeated to form a memory array of vertical strings of memory cells.

Figure 18:
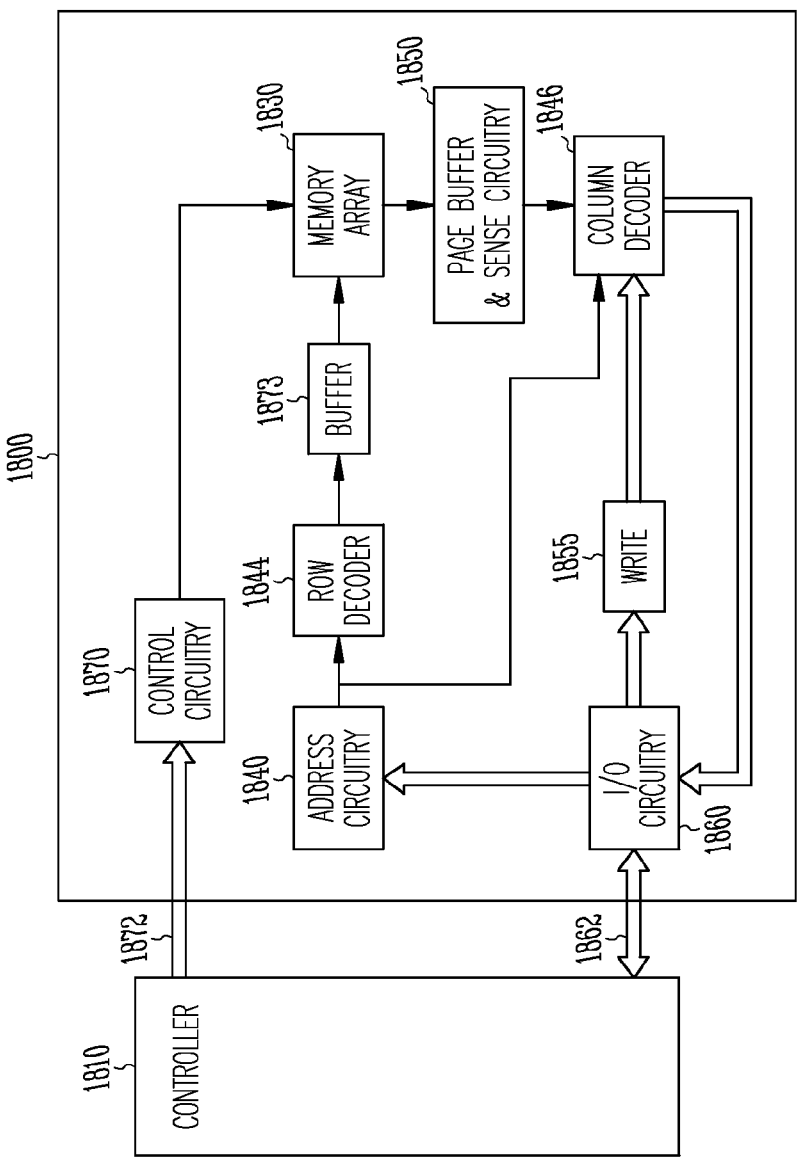
FIG. 18 illustrates a block diagram of a system.

FIG. 18 illustrates a block diagram of one embodiment of a system 1820. The system 1820 includes a memory device 1800 that can comprise a memory array architecture such as the one illustrated in FIG. 2 using the vertical string of memory cell structure of FIG. 17.

The memory device 1800 is coupled to an external controller 1810 (e.g., microprocessor). The external controller 1810 can be configured to transmit commands (e.g., write, read) and control signals to the memory device 1800.

The memory device 1800 includes an array 1830 of memory cells (e.g., NAND architecture non-volatile memory cells). The memory array 1830 is arranged in banks of word line rows and bit line columns. In one embodiment, the columns of the memory array 1830 can comprise the vertical strings of memory cells.

Address buffer circuitry 1840 is provided to latch address signals provided through I/O circuitry 1860 from the external controller 1810. Address signals are received and decoded by a row decoder 1844 and a column decoder 1846 to access the memory array 1830. A row buffer 1873 can be used to buffer data prior to input to the memory array 1830.

The memory device 1800 reads data in the memory array 1830 by sensing voltage or current changes in the memory array columns using sense circuitry/page buffers 1850. The sense circuitry/page buffers 1850 are coupled to read and latch a row of data from the memory array 1830. Data are input and output through the I/O circuitry 1860 for bidirectional data communication as well as the address communication over a plurality of data connections 1862 with the controller 1810. Write circuitry 1855 is provided to write data to the memory array 1830.

Control circuitry 1870 decodes signals provided on a control interface 1872 from the external controller 1810. These signals are used to control the operations of the memory device 1800, including data sense (e.g., read), data write (e.g., program), and erase operations. The control circuitry 1870 may be a state machine, a sequencer, or some other type of control circuitry that is configured to control generation of memory control signals.

An apparatus may be defined as circuitry, integrated circuit die, a device, or a system.

CONCLUSION

One or more embodiments can provide a 3D memory cell structure in a vertical string of memory cells. By forming metal nano-particles adjacent to the floating gate/tunnel dielectric interface (e.g., along the interface and/or in one or both of the materials adjacent to the interface), performance enhancements may be achieved.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for forming a string of memory cells, the method comprising:

forming levels of control gate material, each level of control gate material of the levels of control gate material insulated from adjacent levels of control gate materials of the levels of control gate material;

forming a recess in a level of control gate material of the levels of control gate materials;

forming charge blocking dielectric material in the recess adjacent to the control gate material;

forming floating gate material adjacent to the charge blocking dielectric material in the recess;

forming tunnel dielectric material adjacent to the floating gate material; and forming metal along an interface between the tunnel dielectric material and the floating gate material wherein metal nano-particles are diffused into the floating gate material.

2. The method of claim 1 and further comprising forming levels of insulator material, wherein each level of control gate material of the levels of control gate material is insulated from adjacent levels of control gate material by a respective level of insulator material of the levels of insulator material.

3. The method of claim 1 wherein forming charge blocking dielectric material in the recess adjacent to the control gate material comprises lining the recess with an oxide-nitride-oxide film.

4. The method of claim 1 and further comprising performing a stabilizing treatment of the metal prior to forming the tunnel dielectric material.

5. The method of claim 4 wherein the stabilizing treatment comprises a nitridization process.

6. The method of claim 1 wherein the floating gate material comprises polycrystalline silicon and forming the metal comprises exposing the polycrystalline silicon to a metal precursor gas to form metal nano-particles on the floating gate material.

7. The method of claim 1 wherein the metal comprises metal nano-particles of one of: ruthenium (Ru), ruthenium oxide ($RuO_x$), titanium nitride (TiN), titanium aluminum nitride (TiAlN), tungsten nitride (WN), tungsten carbon nitride (WCN), tungsten silicide ($WSi_x$), tantalum nitride (TaN), tantalum aluminum nitride (TaAlN), ruthenium silicide (RuSi), hafnium silicide (HfSi), hafnium (Hf), zirconium (Zr), zirconium silicide (ZrSi), cobalt silicide (CoSi), or nickel silicide (NiSi).

8. The method of claim 1, wherein forming metal along the interface between the tunnel dielectric material and the floating gate material comprises forming metal nano-particles along the interface between the tunnel dielectric material and the floating gate material.

9. The method of claim 1, wherein forming metal along the interface between the tunnel dielectric material and the floating gate material comprises forming metal nano-particles on a surface of the floating gate material.

10. A method for forming a string of memory cells, the method comprising:

forming levels of control gate material each level of control gate material of the levels of control gate material insulated from adjacent levels of control gate materials of the levels of control gate material;

forming a recess in a level of control gate material of the levels of control gate materials;

forming charge blocking dielectric material in the recess adjacent to the control gate material;

forming floating gate material adjacent to the charge blocking dielectric material in the recess;

forming tunnel dielectric material adjacent to the floating gate material; and forming metal along an interface between the tunnel dielectric material and the floating gate material, wherein forming metal along the interface between the tunnel dielectric material and the floating gate material comprises forming metal nano-particles along a surface of the floating gate material and diffusing at least some of the metal nano-particles into the floating gate material.

11. A method for forming a string of memory cells, the method comprising:

forming levels of control gate material, each level of control gate material of the levels of control gate material insulated from adjacent levels of control gate materials of the levels of control gate material;

forming a recess in a level of control gate material of the levels of control gate materials;

forming charge blocking dielectric material in the recess adjacent to the control gate material;

forming floating gate material adjacent to the charge blocking dielectric material in the recess;

forming tunnel dielectric material adjacent to the floating gate material; and forming metal along an interface between the tunnel dielectric material and the floating gate material, wherein forming metal along the interface between the tunnel dielectric material comprises forming metal nano-particles along a surface of the floating gate material and wherein forming tunnel dielectric material comprises covering the metal nano-particles formed along the surface of the floating gate with the tunnel dielectric material.

12. A method for forming a string of memory cells, the method comprising:

forming levels of control gate material, each level of control gate material of the levels of control gate material insulated from adjacent levels of control gate materials of the levels of control gate material;

forming a recess in a level of control gate material of the levels of control gate materials;

forming charge blocking dielectric material in the recess adjacent to the control gate material;

forming floating gate material adjacent to the charge blocking dielectric material in the recess;

forming tunnel dielectric material adjacent to the floating gate material; and forming metal along an interface between the tunnel dielectric material and the floating gate material, wherein forming metal along the interface between the tunnel dielectric material and the floating gate material comprises forming metal nano-particles on a surface of the floating gate material and diffusing the metal nano-particles into the floating gate material.

13. A method for forming a string of memory cells, the method comprising:

forming levels of control gate material, each level of control gate material of the levels of control gate material insulated from adjacent levels of control gate materials of the levels of control gate material;

forming a recess in a level of control gate material of the levels of control gate materials;

forming charge blocking dielectric material in the recess adjacent to the control gate material;

forming floating gate material adjacent to the charge blocking dielectric material in the recess;

forming tunnel dielectric material adjacent to the floating gate material; and forming metal along an interface between the tunnel dielectric material and the floating gate material, wherein forming metal along the interface between the tunnel dielectric material and the floating gate material comprises forming metal nano-particles on a surface of the floating gate material and diffusing at least some of the metal nano-particles into the floating gate material, an wherein forming tunnel dielectric material comprises covering at least some of the metal nano-particles on the surface of the floating gate material with the tunnel dielectric material.

14. A method for forming a string of memory cells, the method comprising:

forming a source;

forming a first level of insulator material over the source;

forming a first level of conductive material over the first level of insulator material;

forming a second level of insulator material over the first level of conductive material;

forming a plurality of alternating levels of insulator material and control gate material over the second level of insulator material;

forming an opening through the plurality of alternating levels of insulator material and control gate material to at least the second level of insulator material;

removing portions of the levels of control gate material to extend the opening into a plurality of recesses;

forming charge blocking dielectric material in each of the plurality of recesses;

forming floating gate material in each of the plurality of recesses adjacent to the charge blocking dielectric material;

forming metal nano-particles along a surface of the floating gate material formed in each of the plurality of recesses;

performing nitridization of the metal nano-particles;

forming tunnel dielectric material adjacent to the floating gate material formed in each of the plurality of recesses;

filling the opening with a semiconductor material; and forming a second level of conductive material over a top one of the levels of insulator material.

15. The method of claim 14 wherein forming floating gate material in each of the plurality of recesses comprises:

lining the opening with a polycrystalline silicon; and removing the polycrystalline silicon from the opening except from each of the plurality of recesses, wherein each recess of the plurality of recesses remains filled with the polycrystalline silicon.

16. The method of claim 14 wherein forming metal nano-particles along the surface of the floating gate material formed in each of the plurality of recesses comprises:

exposing the opening to a metal precursor gas to form the metal nano-particles along the surface of the floating gate material; and removing excess metal nano-particles from portions of the opening except for along the surface of the floating gate material formed in each of the plurality of recesses.

17. The method of claim 14 and further comprising performing, between forming the metal nano-particles along the surface of the floating gate material and performing nitridization of the metal nano-particles, a cleaning process to remove excess metal nano-particles from portions of the opening where it is not desired to have metal nano-particles.

18. The method of claim 17 and further comprising diffusing at least some of the metal nano-particles into the floating gate material after performing the cleaning process.

19. A method for forming a string of memory cells, the method comprising:

forming levels of control gate material, each level of control gate material of the levels of control gate material insulated from adjacent levels of control gate materials of the levels of control gate material;

forming a recess in a level of control gate material of the levels of control gate materials;

forming charge blocking dielectric material in the recess adjacent to the control gate material;

forming floating gate material adjacent to the charge blocking dielectric material in the recess;

forming tunnel dielectric material adjacent to the floating gate material; and forming metal along an interface between the tunnel dielectric material and the floating gate material, wherein forming the tunnel dielectric material comprises covering the metal formed along the interface with the tunnel dielectric material.

* * * * *